United States Patent
Su et al.

(10) Patent No.: US 6,803,127 B2
(45) Date of Patent: Oct. 12, 2004

(54) ENCAPSULATION OF AN ORGANIC ELECTRO-LUMINESCENCE ELEMENT FOR A DISPLAY DEVICE AND METHOD THEREOF

(75) Inventors: Chih-Hung Su, Kaohsiung (TW); Chih-Feng Sung, Miaoli (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 10/339,019

(22) Filed: Jan. 8, 2003

(65) Prior Publication Data

US 2004/0043249 A1 Mar. 4, 2004

(30) Foreign Application Priority Data

Aug. 30, 2002 (TW) ........................................ 91119775 A

(51) Int. Cl.[7] .............................................. H05B 33/04
(52) U.S. Cl. ........................ 428/690; 428/917; 313/504; 313/512; 427/66; 156/182; 257/100
(58) Field of Search ................................ 428/690, 917, 428/332, 68, 76; 313/504, 506, 512; 427/66; 257/100; 156/182

(56) References Cited

U.S. PATENT DOCUMENTS

| | | | | |
|---|---|---|---|---|
| 6,081,071 A | * | 6/2000 | Rogers | 313/512 |
| 6,656,609 B2 | * | 12/2003 | Takahashi et al. | 428/690 |
| 2002/0132383 A1 | * | 9/2002 | Hiroki et al. | 438/17 |

FOREIGN PATENT DOCUMENTS

TW 459465 10/2001

* cited by examiner

*Primary Examiner*—Dawn L. Garrett
(74) *Attorney, Agent, or Firm*—Ladas & Parry LLP

(57) ABSTRACT

An encapsulation of an organic electro-luminescence element is provided. A luminescent body is formed on the inner surface of a first substrate. A second substrate serves as a planar sealing case. A sealing agent is formed on the rims of the first substrate and the second substrate to bond the first substrate and the second substrate and form an airtight space. A first drying layer is formed on the inner surface of the second substrate within the airtight space.

22 Claims, 2 Drawing Sheets

ENCAPSULATION OF AN ORGANIC ELECTRO-LUMINESCENCE ELEMENT FOR A DISPLAY DEVICE AND METHOD THEREOF

BACKGROUND OF THE INVENTION

1. Field of the Invention

The present invention relates to an organic electro-luminescence (EL) element for a display device and, more particularly, to an encapsulation of an organic EL element for a display device.

2. Description of the Related Art

In an electro-luminescence (EL) element used for a display device, electric current applied to specific fluorescence or phosphorus transforms electricity into luminosity. Based on the materials utilized in a luminescent layer, EL elements are classified into organic and inorganic, wherein the organic EL element employs laminated organic layers having advantages such as thin profile, light-weight, high luminescent efficiency, and low driving voltage. Moreover, based on the materials utilized in an organic luminescent layer, the organic EL elements are classified into molecule-based devices and polymer-based devices. The molecule-based device employs dyes or pigments to form an organic luminescent layer called an organic light emitting display (OLED) The polymer-based device employs conjugate macromolecule to form an organic luminescent layer called a polymer light emitting display (PLED).

In order to prevent the internal space of an organic EL element from developing high humidity, a sealing case is commonly used to package a glass substrate on which metal electrodes and one or more organic luminescent layers are formed. Also, in order to prolong the active lifetime, a desiccant is provided to absorb moisture and impurities generated in the interior space, the water and oxygen permeating from the atmosphere, and the moisture generated from the outgassing effect caused by the bonding agent on the rim of the sealing case. Furthermore, various technologies for reducing interior humidity have been developed to eliminate dark spots, such as forming photo-hardened resin on the glass substrate, plating a metal oxide, fluoride or sulfide on the glass substrate, forming a water-resistant film on the glass substrate, and using an airtight case to package the organic EL element. Nevertheless, other problems, such as leakage current, crosstalk and oxide dissolution, remain to be solved.

As shown in FIG. 1, U.S. Pat. No. 5,882,761 discloses an encapsulation 1 of an organic EL element, which comprises a glass substrate 10, a sealing agent 9 composed of a UV-cured resin formed on the rim of the glass substrate 10, and a sealing case 7 bonded to the glass substrate 10 by the sealing agent 9. Thus, an internal space 11 formed by the glass substrate 10 and the sealing case 7 becomes an airtight space. In the airtight space, a lamination body 6 formed on the glass substrate 10 comprises an anode layer 3, an organic luminescent material layer 4, and a cathode layer 5. A drying substance 8 may be disposed on the bottom of the sealing case 7 and separated from the lamination body 6 by an internal space 11 filled with dried inert gas. The drying substance 8 comprises a solid compound, such as BaO, CaO, $CaSO_4$, and $CaCl_2$, which chemically absorbs moisture and remains in solid state. The drying substance 8 is a sheet body fixed on the concave of the sealing case 7 via bonding.

To provide an attachment area for the drying substance 8, however, the fabrication of the sealing case 7 having a concave bottom necessitates an all-in-one technology, which may encounter problems, such as shaping difficulties, high process costs, and a difficult in applying to glass materials. Also, as the depth of the concave of the sealing case 7 increases, the volume of the internal space 11 increases to provide a larger space for accommodating moisture and oxygen, resulting in an uncertainty of the moisture-absorbing effectiveness provided by the drying substance 8. Moreover, the design of the sealing case 7 having a concave will unfavorably increase the thickness of the encapsulation structure, which does not conform to the development trend toward light-weight, thin profile and small size characteristics of the panel display.

SUMMARY OF THE INVENTION

The present invention provides an encapsulation of an organic electro-luminescence element for a display device and a method for encapsulating the same to solve the problems accompanied by the prior art.

In an encapsulation of an organic electro-luminescence element for a display device, a luminescent body is formed on the inner surface of a first substrate. A second substrate serves as a planar sealing case. A sealing agent is formed on the rims of the first substrate and the second substrate to bond the first substrate and the second substrate and form an airtight space. A first drying layer is formed on the inner surface of the second substrate within the airtight space.

Accordingly, it is an object of the invention to form the drying layer on the planar sealing case by sputtering to simplify the encapsulating process.

It is another object of the invention to form the drying layer on the planar sealing case by sputtering to reduce process cost of the sealing case.

Yet another object of the invention is to form the drying layer on the planar sealing case by sputtering to increase material selectivity of the sealing case.

It is a further object of the invention to provide a combination of the sealing case having a planar profile and the drying layer with an extremely thin deposition, resulting in a smaller volume of the internal space 32 as compared with the prior art.

These and other objects and advantages of the present invention will become readily apparent upon further reference to the following detailed description and the accompanying drawings.

BRIEF DESCRIPTION OF THE DRAWINGS

Similar reference numerals denote corresponding features consistently throughout the attached drawings.

DETAILED DESCRIPTION OF THE INVENTION

[First Embodiment]

Figure 1:
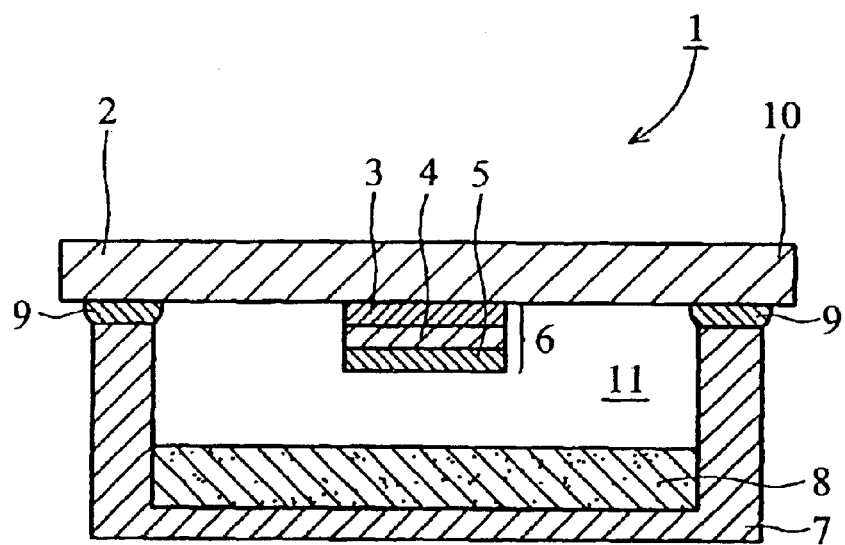
FIG. 1 is a sectional diagram showing an encapsulation of an organic EL element according to the prior art.
Figure 2:
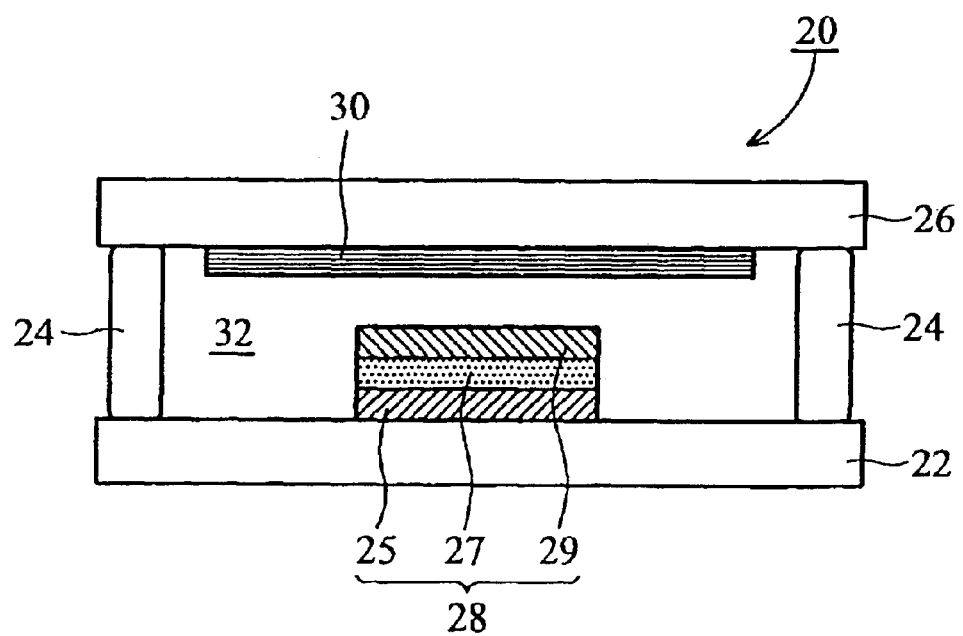
FIG. 2 is a sectional diagram showing an encapsulation of an organic EL element according to the first embodiment of the present invention.

FIG. 2 is a sectional diagram showing an encapsulation of an organic EL element according to the first embodiment of the present invention. The encapsulation 20 of an organic EL element comprises a substrate 22, a sealing agent 24 formed on the rim of the substrate 22, and a sealing case 26 bonded to the substrate 22 by the sealing agent 24. Thus, the substrate 22 and the sealing case 26 form an airtight space. Preferably, the substrate 22 is a transparent insulating material such as glass, polymer, or ceramic. The sealing agent 24 may be composed of a UV-cured resin, and the sealing case 26 is preferably a plane substrate made of glass, polymer, ceramic, or metal.

Also, on the inner surface of the substrate 22, a lamination body 28 is formed by an anode layer 25, an organic luminescent material layer 27 and a cathode layer 29. A drying layer 30 is deposited on the inner surface of the sealing case 26 by sputtering and separated from the lamination body 28 by an internal space 32. In this preferred embodiment of the present invention, the drying layer 30 is a metal oxide (e.g. alkaline metal oxide and alkaline-earth metal oxide), metal sulfide, metal halide, metal perchlorate, or a highly active metal (e.g. alkaline metal and alkaline-earth metal). Preferably, the thickness of the drying layer 30 is less than 10 μm.

The drying layer 30 is sputtered on the inner surface of the sealing case 26 so that it is not necessary to form a concave on the sealing case 26 by an additional shaping process, or fill the internal space 32 with other drying substances. This not only simplifies the encapsulating process and therefore reduces process cost of the sealing case 26, but also increases material selectivity of the sealing case 26. Moreover, since sputtering can easily control the quality and thickness of the drying layer 30, a combination of the sealing case 26 having a planar profile and the drying layer 30 with an extremely thin deposition can result in a smaller volume of the internal space 32 as compared to the prior-art. This feature also conforms to the development trend toward light-weight, thin profile, and small size characteristics of the panel display.

[Second Embodiment]

Figure 3:
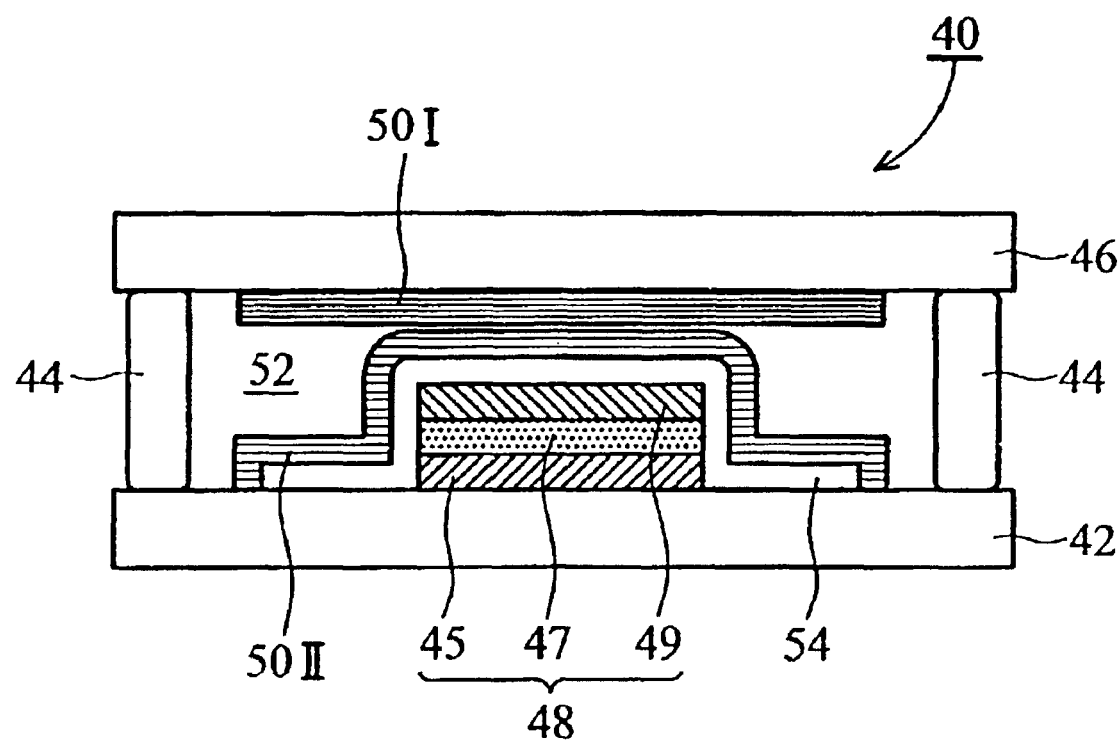
FIG. 3 is a sectional diagram showing an encapsulation of an organic EL element according to the second embodiment of the present invention.

FIG. 3 is a sectional diagram showing an encapsulation of an organic EL element according to the second embodiment of the present invention. An encapsulation 40 of an organic EL element comprises a substrate 42, a sealing agent 44 formed on the rim of the substrate 42, and a sealing case 46 bonded to the substrate 42 by the sealing agent 44. Thus, the substrate 42 and the sealing case 46 form an airtight space. Preferably, the substrate 42 is a transparent insulating material such as glass, polymer, or ceramic. The sealing agent 44 may be composed of a UV-cured resin, and the sealing case 46 is a plane substrate made of glass, polymer, ceramics, or metal.

Also, a lamination body 48 including an anode layer 45, an organic luminescent material layer 47 and a cathode layer 49 is formed on the inner surface of the substrate 42. In this preferred embodiment of the present invention, a buffering layer 54 is deposited on the substrate 42 to cover the lamination body 48, and a second drying layer 50II is deposited on the substrate 42 to cover the buffering layer 54. Furthermore, a first drying layer 50I is deposited on the inner surface of the sealing case 46, and separated from the second drying layer 50II by an internal space 52. Preferably, the buffering layer 54 is a high dielectric constant material, or a polymer material with a high dielectric constant. In this preferred embodiment of the present invention, the first drying layer 50I and the second drying layer 50II are both formed by sputtering. Preferably, the drying layers 50I and 50II are metal oxides (e.g. alkaline metal oxide and alkaline-earth metal oxide), metal sulfide, metal halide, metal perchlorate, or a highly active metal (e.g. alkaline metal and alkaline-earth metal). Preferably, the thicknesses of both drying layers 50I and 50II are less than 10 μm.

As compared with the first embodiment of the present invention, the second embodiment advantageously forms a protection structure including the buffering layer 54 and the second drying layer 50II on the lamination body 48 to provide a better drying effect and a longer lifetime for the organic EL element. Also, the combination of the first drying layer 50I, the second drying layer 50II and the buffering layer 54 can further reduce the volume of the internal space 52.

While the present invention has been described with reference to specific embodiments thereof, it is to be understood that the present invention is not limited to the embodiments described above, but rather encompasses any and all embodiments within the spirit and scope of the present invention as set forth in the claims.

What is claimed is:

1. An encapsulation of an organic electro-luminescence element, comprising:

a first substrate;

a luminescent body formed on an inner surface of said first substrate;

a second substrate serving as a planar sealing case;

a seating agent formed on the rims of said first substrate and said second substrate, said sealing agent bonding said first substrate and said second substrate to form an airtight space;

a first drying layer formed on the inner surface of said second substrate within the airtight space;

a buffering layer deposited on the inner surface of said first substrate to cover said luminescent body; and a second drying layer covering said buffering layer within the airtight space.

2. The encapsulation of an organic electro-luminescence element according to claim 1, wherein said first drying layer is formed by sputtering.

3. The encapsulation of an organic electro-luminescence element according to claim 1, wherein said first drying layer is a metal oxide, metal sulfide, metal halide, metal perchlorate, or a highly active metal.

4. The encapsulation of an organic electro-luminescence element according to claim 1, wherein the thickness of said first drying layer is less than 10 mm.

5. The encapsulation of an organic electro-luminescence element according to claim 1, wherein said sealing agent is composed of a UV-cured resin.

6. The encapsulation of an organic electro-luminescence element according to claim 1, wherein said luminescent body is a lamination structure comprising at least an anode layer, an organic luminescent material layer and a cathode layer.

7. The encapsulation of an organic electro-luminescence element according to claim 1, wherein said buffering layer is a high dielectric constant material or a polymer material with a high dielectric constant.

8. The encapsulation of an organic electro-luminescence element according to claim 1, wherein said second drying layer is a metal oxide, metal sulfide, metal halide, metal perchlorate, or a highly active metal.

9. The encapsulation of an organic electro-luminescence element according to claim 1, wherein said first substrate is a transparent insulating material selected from a group consisting of glass, polymer, and ceramic.

10. The encapsulation of an organic electro-luminescence element according to claim 1, wherein said second substrate is a transparent insulating material selected from a group consisting of glass, polymer, and ceramic.

11. The encapsulation of an organic electro-luminescence element according to claim 1, wherein the organic electro-luminescence element is an organic light emitting display (OLED) or polymer light emitting display (PLED).

12. A method for encapsulating an organic electro-luminescence element, comprising steps of:
providing a first substrate, wherein a luminescent body is formed on an inner surface of said first substrate;
providing a second substrate serving as a planar sealing case;
forming a first drying layer on the inner surface of said second substrate;
forming a buffering layer on the inner surface of said first substrate to cover said luminescent body;
forming a second drying layer to cover said buffering layer within the airtight space; and
forming a sealing agent on the rims of said first substrate and said second substrate, wherein the sealing agent bonds said first substrate and said second substrate to form an airtight space.

13. The method for encapsulating an organic electro-luminescence element according to claim 12, wherein said first drying layer is formed within the airtight space by sputtering.

14. The method for encapsulating an organic electro-luminescence element according to claim 12, wherein said first drying layer is a metal oxide, metal sulfide, metal halide, metal perchlorate, or a highly active metal.

15. The method for encapsulating an organic electro-luminescence element according to claim 12, wherein the thickness of said first drying layer is less than 10 mm.

16. The method for encapsulating an organic electro-luminescence element according to claim 12, wherein said sealing agent is a UV-cured resin.

17. The method for encapsulating an organic electro-luminescence element according to claim 12, wherein said luminescent body is a lamination structure comprising at least an anode layer, an organic luminescent material layer and a cathode layer.

18. The method for encapsulating an organic electro-luminescence element according to claim 12, wherein said buffering layer is a high dielectric constant material or a polymer material with a high dielectric constant.

19. The method for encapsulating an organic electro-luminescence element according to claim 12, wherein said second drying layer is a metal oxide, metal sulfide, metal halide, metal perchlorate, or a highly active metal.

20. The method for encapsulating an organic electro-luminescence element according to claim 12, wherein said first substrate is a transparent insulating material selected from a group consisting of glass, polymer, and ceramic.

21. The method for encapsulating an organic electro-luminescence element according to claim 12, wherein said second substrate is a transparent insulating material selected from a group consisting of glass, polymer, and ceramic.

22. The method for encapsulating an organic electro-luminescence element according to claim 12, wherein said organic electro-luminescence element is an organic light emitting display (OLED) or polymer light emitting display (PLED).

* * * * *